(12) United States Patent
Wilhelm

(10) Patent No.: US 8,502,615 B2
(45) Date of Patent: *Aug. 6, 2013

(54) JUMPLESS PHASE MODULATION IN A POLAR MODULATION ENVIRONMENT

(75) Inventor: Michael Wilhelm, Furstenfeldbruck (DE)

(73) Assignee: Intel Mobile Communications GmbH, Neubiberg (DE)

( * ) Notice: Subject to any disclaimer, the term of this patent is extended or adjusted under 35 U.S.C. 154(b) by 288 days.

This patent is subject to a terminal disclaimer.

(21) Appl. No.: 12/972,513

(22) Filed: Dec. 19, 2010

(65) Prior Publication Data

US 2011/0084777 A1    Apr. 14, 2011

Related U.S. Application Data

(63) Continuation of application No. 12/233,318, filed on Sep. 18, 2008, now Pat. No. 7,872,545.

(51) Int. Cl.
*H03C 3/38* (2006.01)

(52) U.S. Cl.
USPC ............................ 332/145; 332/103; 332/144

(58) Field of Classification Search
USPC .......................................... 332/103, 144, 145
See application file for complete search history.

(56) References Cited

U.S. PATENT DOCUMENTS 3,440,656 A * 4/1969 Wong et al. ................... 342/434

OTHER PUBLICATIONS

History from U.S. Appl. No. 12/233,318, filed Sep. 18, 2008, Sep. 13, 2010 Notice of Allowance and Fees Due (PTOL-85); Sep. 13, 2010.

* cited by examiner

*Primary Examiner* — Joseph Chang
(74) *Attorney, Agent, or Firm* — SpryIP, LLC

(57) ABSTRACT

A circuit includes a phase shifter configured to selectively shift a phase of a baseband phase signal in accordance with a zero crossing signal to output a selectively phase-shifted signal, a phase modulator configured to provide a phase modulated carrier signal in accordance with the selectively phase-shifted signal, and an inverter configured to selectively invert the phase modulated carrier signal in accordance with the zero crossing signal.

24 Claims, 6 Drawing Sheets

TIME-VARYING BASEBAND INFORMATION

JUMPLESS PHASE MODULATION IN A POLAR MODULATION ENVIRONMENT

RELATED APPLICATIONS

This application is a Continuation of co-pending application Ser. No. 12/233,318, which was filed on Sep. 18, 2008. The entire contents of the co-pending Application are hereby incorporated herein by reference.

BACKGROUND

Digital communications use a variety of carrier signal modulation schemes. Numerous of these utilize in-phase (I) and quadrature (Q) signals to modulate baseband information onto a radio frequency (RF) carrier. The respective I and Q signals are phase-orthogonal to one another and are readily represented in a Cartesian coordinate system. However, noise filtering and other performance considerations have motivated the development of other modulation schemes known as polar modulation. Therein, time-varying amplitude (A) and phase angle (ED) signals are used to modulate baseband information onto a RF carrier. Polar modulation generally achieves better signal quality and less electrical current consumption compared to IQ modulation techniques.

FIG. 1 graphically depicts an illustrative polar modulation scheme in accordance with known techniques for a four-symbol digital communication environment. Digital baseband information—that is, the digital intelligence to be modulated onto a carrier wave—is represented by a time-varying amplitude signal 100 and a time-varying phase signal 102.

FIG. 2 is a block diagram depicting an illustrative polar modulation system 200 in accordance with known techniques. The system 200 includes a phase modulator 202 configured to modulate the phase of a radio frequency (RF) carrier signal in accordance with a baseband phase signal input. The system 200 also includes a mixer 204 that receives the phase modulated RF carrier signal from the phase modulator 202. The system 200 further includes an amplitude modulator 206 configured to provide an amplitude modulation signal to the mixer 204 in accordance with a baseband amplitude signal input. The mixer 204 modulates the amplitude of the phase modulated RF carrier signal in accordance with the amplitude modulation signal from the amplitude modulator 206. The mixer 204 thus provides a polar modulated carrier signal.

Returning to FIG. 1, the illustrative polar modulated carrier signal is graphically depicted in a constellation diagram 104. The constellation diagram 104 includes four, two-bit digital symbols 106, 108, 110 and 112, respectively. In this way, the constellation diagram 104 can be referred to as a constellation of four symbols 106-112, each represented by a particular polar modulation of the RF carrier signal. Under the present illustration, a stream of digital baseband information is modulated onto an RF carrier signal one symbol—two digital bits—at a time. It is important to note that a polar modulation system (e.g., system 200) must be able to accommodate "zero crossings" of the digital baseband information during such an operation.

By way of example, and not limitation, the constellation diagram 104 depicts an operational instance wherein the digital information "1100" is modulated onto the RF carrier signal. Thus, the symbol 106 and then the symbol 110 must be sequentially modulated onto the RF carrier. In doing so, the baseband amplitude signal 100 swings from full value, to zero, and then back to full value in the time domain, an operation readily accommodated by the amplitude modulator (e.g., 206). However, the baseband phase signal 102 is required to instantaneously shift one-hundred eighty degrees in the time domain—a situation referred to herein as a "zero crossing" scenario. As a result, a compliant phase modulator (e.g., 202) must accommodate nearly infinite frequencies— something impossible to realize thus far without distortions due to the limited bandwidth inherent to known real-world implementations. While the illustrative polar modulation scenario described above is set in the context of four digital symbols, it is to be appreciated that other polar modulation schemes (and their corresponding constellations) having other symbol counts (e.g., eight, sixteen, etc.) are contemplated herein.

FIG. 3 graphically depicts phase modulator 202 output signal characteristics during zero crossing by way of respective signal plots 302 and 304. In any case, polar modulation methods and systems that address the foregoing considerations are desirable.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Figure 1:
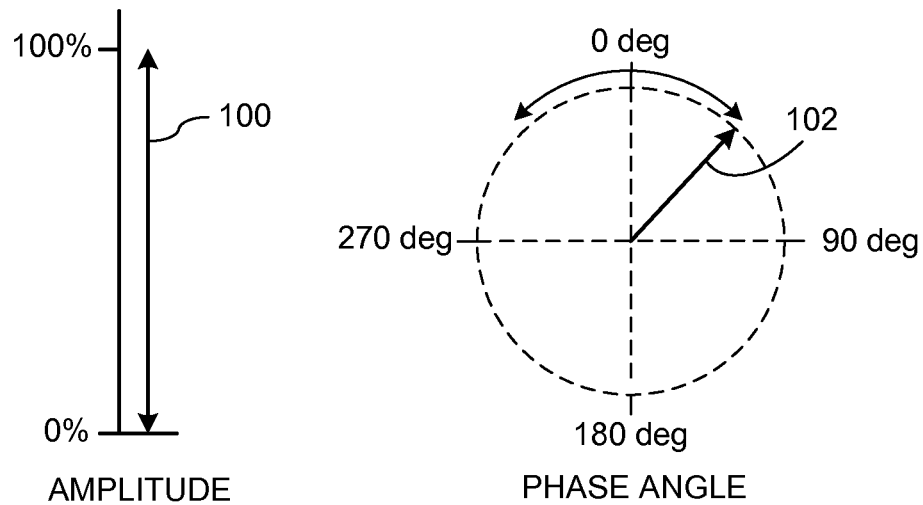
FIG. 1 is a diagram depicting polar modulation signals in accordance known techniques.
Figure 1:
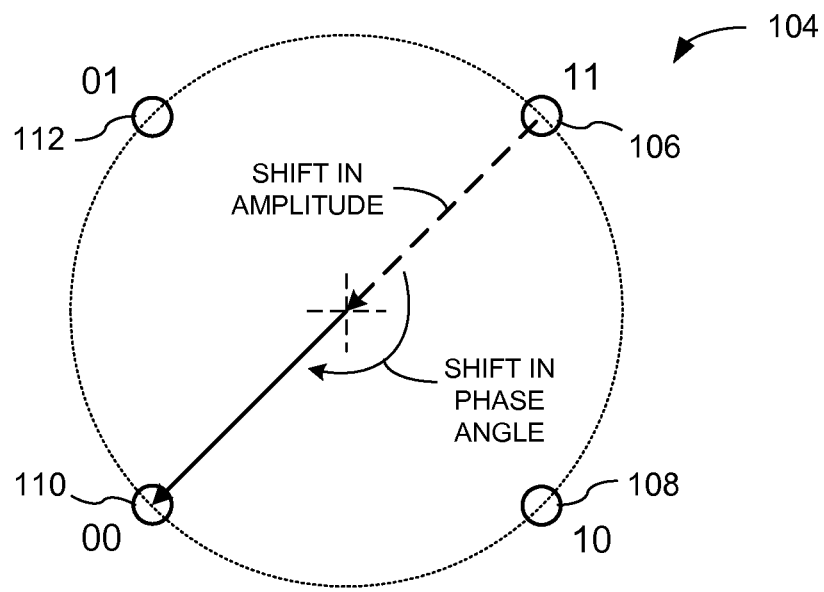
Figure 2:
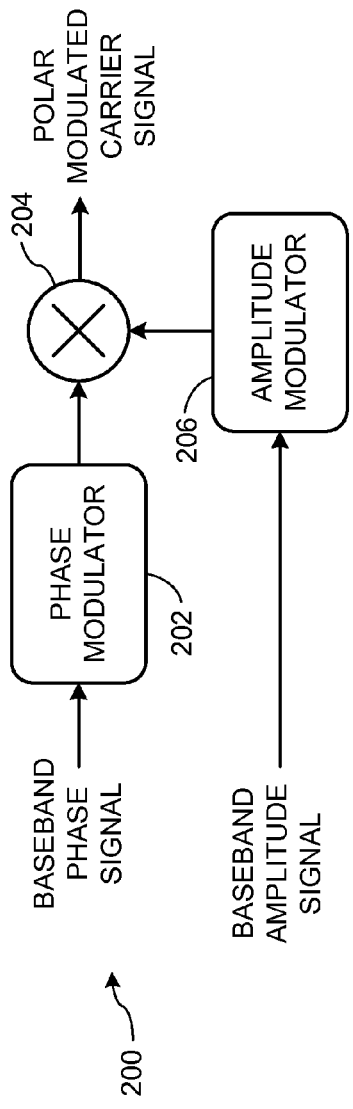
FIG. 2 is a block diagram depicting a polar modulation system according to known techniques.
Figure 3:
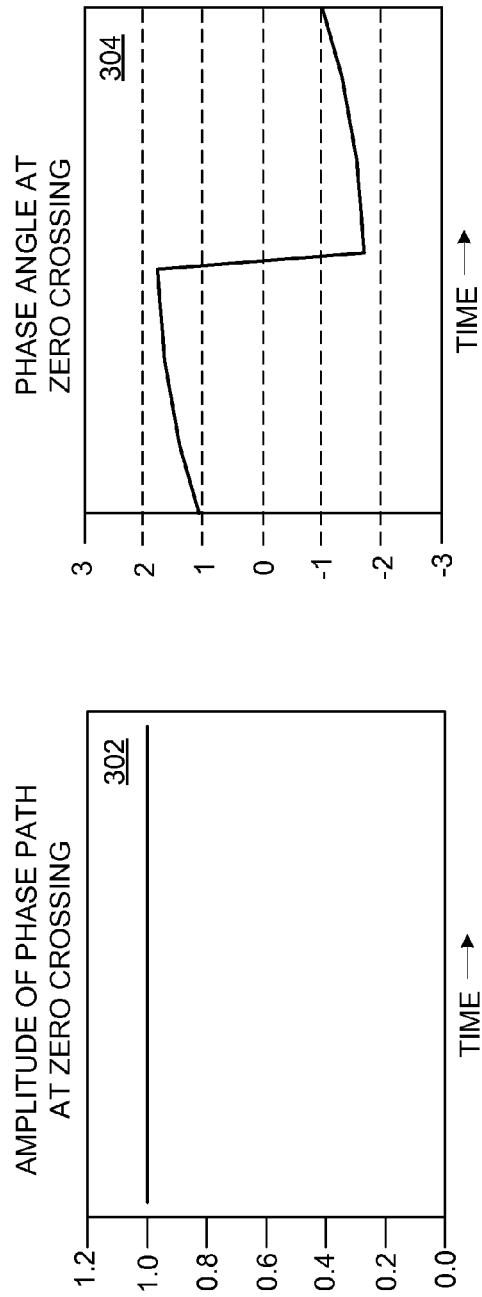
FIG. 3 includes two signal diagrams according to known techniques.

Disclosed herein are improved techniques for improving the performance of a polar modulator. Techniques in accordance with the present disclosure may advantageously improve operating bandwidth when transmitting digital information by way of a polar modulated carrier signal. In general, such techniques are useful in a wide range of applications, including wireless Internet access, audio and/or video communications, and so on.

According to one implementation, a circuit is disclosed. The circuit may comprise at least a phase shifter, a phase modulator, and an inverter. The phase shifter selectively shifts a phase of a baseband phase signal one hundred eighty degrees in accordance with a zero crossing signal to output a selectively phase-shifted signal. The phase modulator provides a phase modulated carrier signal in accordance with the selectively phase-shifted signal. The inverter selectively inverts the phase modulated carrier signal in accordance with the zero crossing signal.

According to another implementation, a modulation circuit is disclosed. The modulation circuit may comprise a phase shifter, a phase-lock loop, a variable controlled oscillator, and a switch. The phase shifter is configured to selectively shift a phase of a baseband phase signal one hundred eighty degrees in accordance with a zero crossing signal to output a selectively phase-shifted signal. The phase-lock loop is configured to provide a phase modulation signal in accordance with the selectively phase-shifted signal. The variable controlled oscillator is configured to provide a differential phase modulated signal in accordance with the phase modulation signal, the differential phase modulated signal provided by way of a first node and a second node. The switch is configured to selectively route the differential phase modulated signal from the first node and the second node to a third node and a fourth node in accordance with a zero crossing input signal.

According to still another implementation, a method is performed at least in part by an electronic circuit. The method includes selectively shifting a phase of a baseband phase signal one hundred eighty degrees in accordance with a zero crossing signal to output a selectively phase-shifted signal. The method also includes deriving a phase modulated radio frequency carrier signal from the selectively phase-shifted signal. The method further includes selectively inverting the phase modulated radio frequency carrier signal in accordance with the zero crossing signal.

In yet another implementation, an apparatus includes a source of electrical energy. The electronic circuit also includes an electronic circuit coupled to the source of electrical energy. The electronic circuit is configured to selectively shift a phase of a baseband phase signal one hundred eighty degrees in accordance with a zero crossing signal, derive a phase modulated radio frequency carrier signal, and selectively invert the phase modulated radio frequency carrier signal in accordance with the zero crossing signal. The electronic circuit is further configured to derive an amplitude modulated signal from a baseband amplitude signal and mix the selectively inverted phase modulated carrier signal with the amplitude modulated signal so as to derive a polar modulated carrier signal.

Circuits and other functional aspects provided herein can be fabricated, at least in part, on a common substrate such that one or more respective integrated circuit devices are defined. In one or more implementations, at least a portion of the functional subject matter presented herein can be fabricated within a 130, 90, 65, 45, or 32 nanometer (or smaller) environment.

The techniques described herein may be implemented in a number of ways. Illustrative context is provided below with reference to the included figures and ongoing discussion.

First Illustrative Implementation

Figure 4:
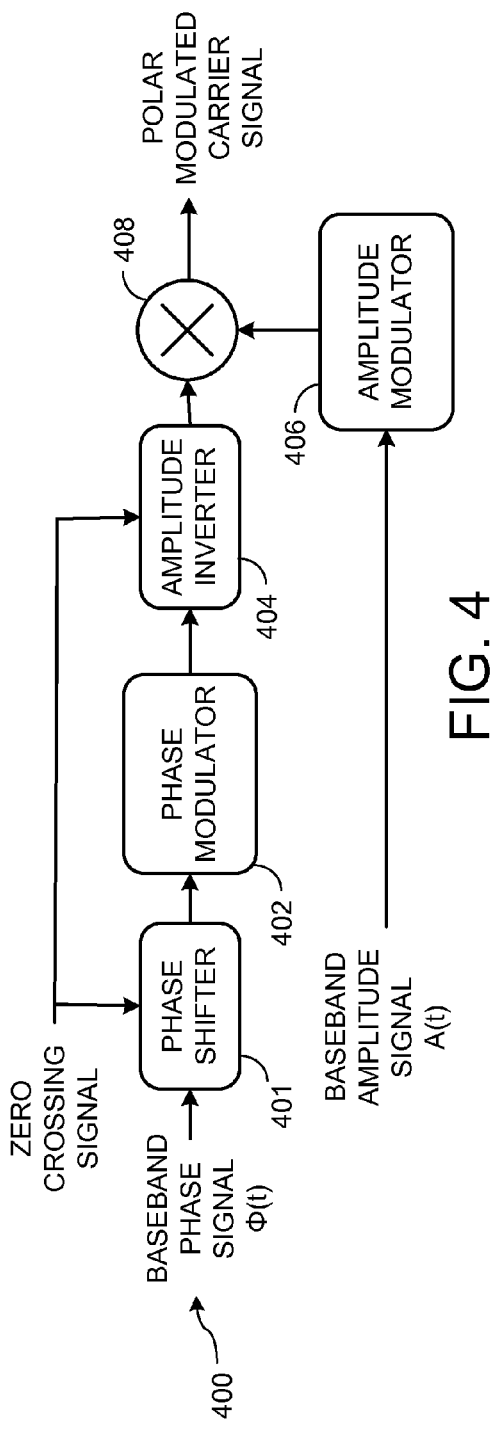
FIG. 4 is a polar modulation system according to the present teachings.

FIG. 4 is a block diagram depicting a polar modulation system 400 in accordance with the present teachings. The system 400 includes a phase shifter 401 and a phase modulator 402. The phase shifter 401 is configured to selectively shift the phase of a baseband phase signal $\Phi(t)$ one hundred eighty degrees in accordance with the instantaneous state of a zero crossing input signal to output a selectively phase-shifted signal. The phase of the baseband phase signal is selectively shifted one hundred eighty degrees to output a selectively phase-shifted signal when zero crossing occurs. The baseband phase of the baseband phase signal is not shifted when no zero crossing occurs. The signal $\Phi(t)$ is time-variant and corresponds to a predefined digital symbol modulation scheme (constellation). The phase modulator 402 is configured to modulate the phase of an RF carrier signal in accordance with the selectively phase-shifted signal.

The system 400 also includes an amplitude inverter 404. The amplitude inverter 404 is configured to selectively invert (i.e., swap polarities, or "flip") the amplitude characteristic of the phase modulated RF carrier signal in accordance with the instantaneous state of a zero crossing input signal. The overall operation of the system is as follows. When zero crossing occurs, the baseband phase signal $\Phi(t)$ undergoes a phase shift of one hundred eighty degrees, phase modulation, and amplitude inversion. When zero crossing does not occur, the baseband phase signal $\Phi(t)$ undergoes only phase modulation without undergoing a phase shift of one hundred eighty degrees or amplitude inversion. The state of the zero crossing signal can be determined according to the next required polar modulation dictated by the digital baseband information stream. By example, and not by limitation, a look-up table or state machine (not shown) designed in accordance with the corresponding symbol constellation can be used to provide the zero crossing signal. The zero crossing signal is time-synchronized with the baseband phase signal $\Phi(t)$. In one or more implementations, the zero crossing signal is provided as a single-bit digital signal, such as "0" representing no zero crossing and "1" representing zero crossing or near zero crossing (see discussion below), or vice versa. In any case, the zero crossing signal is readily derived, the phase of the baseband phase signal is selectively shifted one hundred eighty degrees, and the amplitude inverter 404 selectively inverts the phase-modulated RF carrier signal accordingly.

Another similar scenario, "near zero crossing" is also considered. A "near zero crossing" occurs when the signal trajectory approaches the origin of the constellation diagram at a predetermined distance. A circuit can be designed to detect the distance of the signal trajectory to the origin of the constellation diagram. When the distance is below the predetermined distance, the value of the zero crossing signal changes from "0" to "1" or vice versa. Also, the zero crossing signal can be designed in another way. For example, the zero crossing signal can be a continuous signal, defining the distance of the signal trajectory to the origin of the constellation diagram, instead of a single-bit digital signal. In this situation, a "near zero crossing" occurs when the zero crossing signal is smaller than a predetermined value or/and a phase jump bigger than a predetermined value.

The system 400 also includes an amplitude modulator 406. The amplitude modulator 406 is configured to receive a baseband amplitude signal $A(t)$ and to provide a corresponding amplitude modulation signal. The baseband amplitude signal $A(t)$ is time-variant and corresponds to the same predefined digital symbol constellation as that of the baseband phase signal $\Phi(t)$. The system further includes a mixer 408. The mixer 408 is configured to receive the selectively inverted phase-modulated RF carrier signal from the amplitude inverter 404 and the amplitude modulation signal from the amplitude modulator 406. In turn, the mixer 408 modulates the amplitude characteristic of the selectively inverted phase-modulated RF carrier signal, thus deriving a polar modulated carrier signal. The polar modulated carrier signal can then be further processed and/or utilized (e.g., power amplified, transmitted as a wireless signal, etc.).

When zero crossing occurs, the baseband phase signal $\Phi(t)$ has a phase change of one hundred eighty degrees. However, the phase shifter 401 also shifts back one hundred eighty degrees. Therefore, the phase input to the phase modulator 402 is continuous, without any abrupt changes. Also, even when a near zero crossing occurs, the phase input to the phase modulator 402 is still almost continuous with only a very small variation. Thus, the modulation quality is still improved. The result is a modulation system 400 in which the phase modulator 402 can function without the distortion that typically occurs during normal zero crossing operation. Also, the bandwidth requirements of the phase modulator are relaxed and modulation quality is improved. Greater overall polar modulated carrier signal fidelity and data bandwidth (i.e., throughput) are achieved by way of the system 400.

Figure 5:
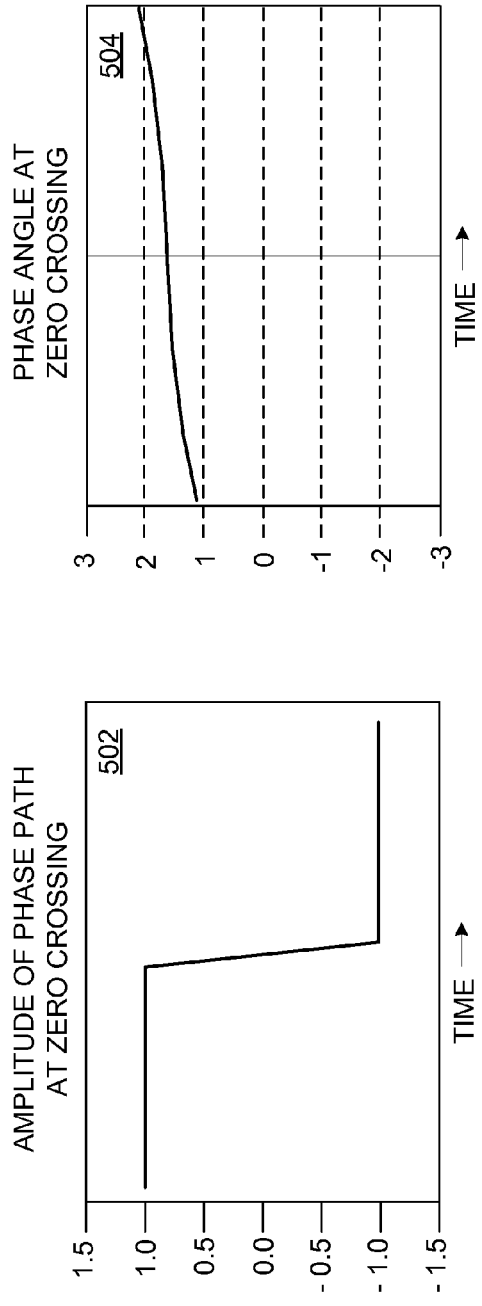
FIG. 5 includes two signal timing diagrams according to the present teachings.

FIG. 5 graphically depicts phase modulator 402 output signal characteristics during zero crossing by way of respective signal plots 502 and 504.

Illustrative Method

Figure 6:
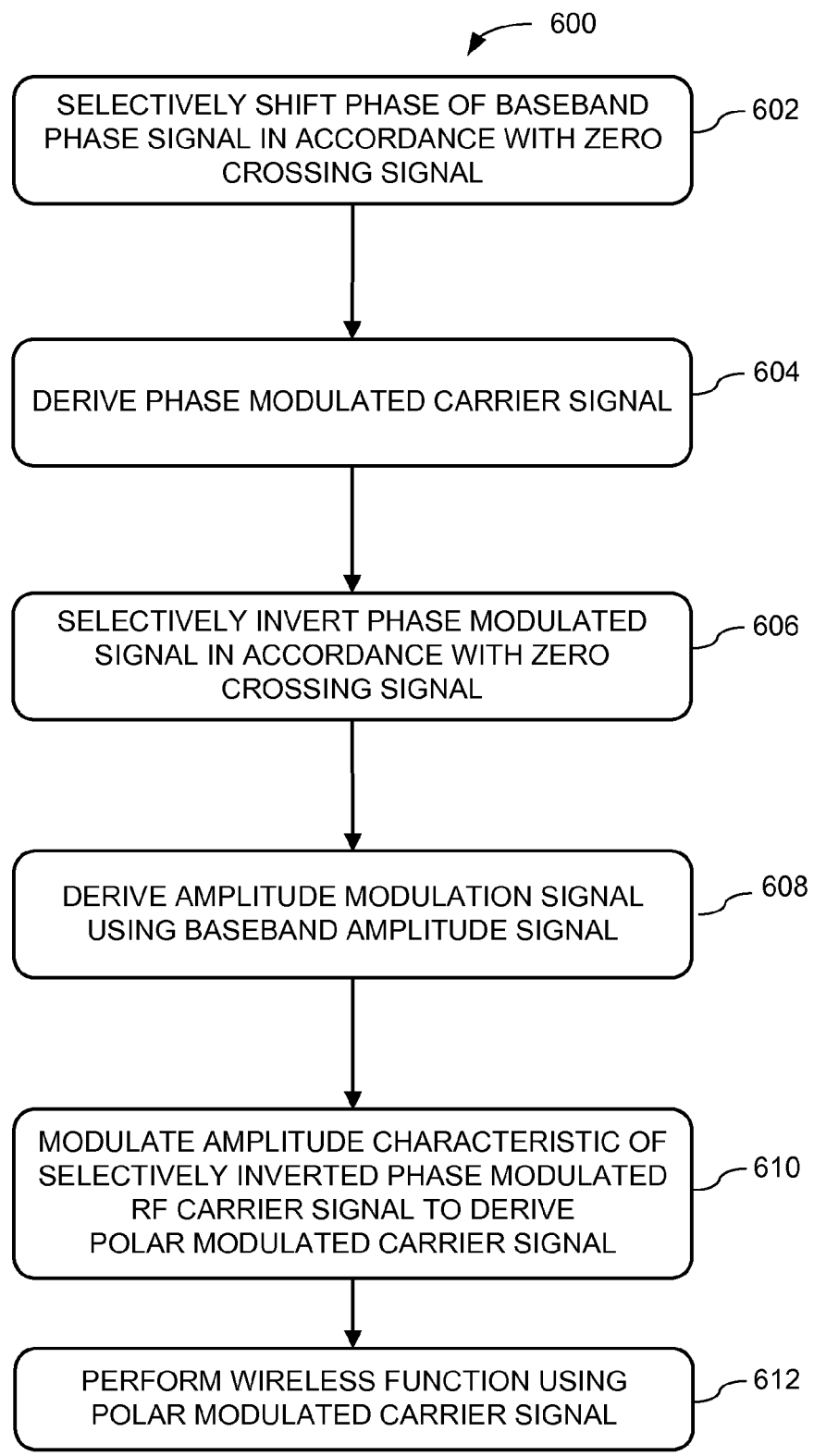
FIG. 6 is a flow diagram depicting operational steps in accordance with the present teachings.

FIG. 6 is a flow diagram depicting a method 600 according to the present teachings. The method 600 includes particular steps and order of execution. However, it is to be understood that other methods respectively including other steps, and/or omitting one or more of the depicted steps, and/or proceeding in other orders of execution may also be used in accordance with the present teachings. Therefore, the method 600 is illustrative and non-limiting with respect to the operations contemplated by the present teachings.

At 602, the phase of a baseband phase signal is selectively shifted one hundred eighty degrees in accordance with a zero crossing signal to output a selectively phase-shifted signal when zero crossing occurs. The phase of the baseband phase signal is not shifted when no zero crossing occurs.

At 604, a phase modulated carrier signal is derived in correspondence to the selectively phase-shifted signal after the selectively phase-shifted signal undergoes phase modulation.

At 606, the amplitude characteristic of the phase modulated carrier signal derived at 604 above is selectively inverted in accordance with the zero crossing signal. As used herein, inversion refers to flipping the polarity (or sign) of the carrier signal with respect to its original polarity. However, the instantaneous time-rate-of-change of the phase modulated carrier signal, in the absolute sense, is not affected. The inverted signal is essentially a mirror image of the original phase modulated signal. In any case, either the original (non-inverted) or the inverted phase modulated carrier signal is routed on for further processing in accordance with the method 600.

At 608, an amplitude modulation signal is derived in accordance with a baseband amplitude signal. The amplitude modulation signal corresponds to the same digital symbol constellation as that used at 604 above.

At 610, the amplitude characteristic of the (original or inverted) phase modulated carrier signal is modulated in accordance with the amplitude modulation signal derived at 608 above. In so doing, a polar modulated carrier signal is derived. The polar modulated carrier signal corresponds to a predetermined digital symbol constellation (e.g., four symbols, eight symbols, etc.). As such, the polar modulated carrier signal conveys a stream of digital information in accordance with a predetermined communications protocol.

At 612, the polar modulated carrier signal is used to perform a wireless function used for all digital modulation standards, such as Universal Mobile Telecommunications System (UMTS) and Long Term Evolution (LTE). By way of example, and not by limitation, the polar modulated carrier signal is used to facilitate an Internet browsing session by way of a cellular telephone and a cellular services infrastructure (i.e., service provider). Any number of other illustrative and non-limiting usage scenarios can also be performed using the polar modulated carrier signal generating in accordance with the method 600.

Second Illustrative Implementation

Figure 7:
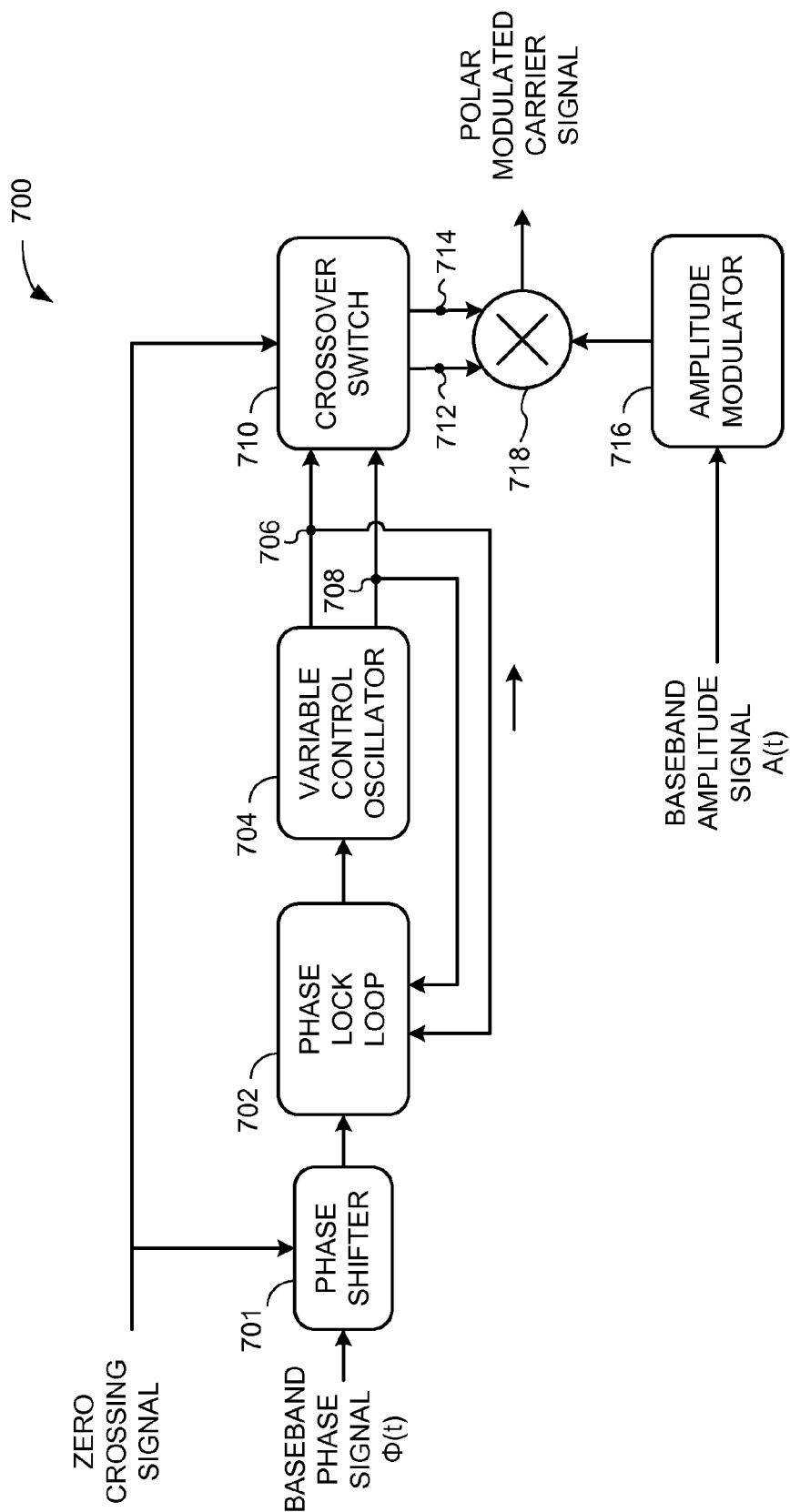
FIG. 7 is another polar modulation system in accordance with the present teachings.

FIG. 7 is a block diagram depicting another implementation of polar modulation system 700 in accordance with the present teachings. The system 700 includes a phase shifter 701 and a phase lock loop (PLL) 702. The phase shifter 701 is configured to selectively to shift the phase of a baseband phase signal Φ(t) one hundred eighty degrees to output a selectively phase-shifted signal in accordance with the instantaneous state of a zero crossing input signal. When zero crossing occurs, the baseband phase signal Φ(t) undergoes a phase shift of one hundred eighty degrees. When no zero crossing occurs, the phase of the baseband phase signal Φ(t) is not shifted. The PLL 702 is configured to receive selectively phase-shifted signal. The PLL 702 is further configured to generate and provide a phase modulation signal to a variable controlled oscillator (VCO) 704 of the system 700.

The system 700 also includes the VCO 704 as introduced above. The VCO 704 is configured to provide a phase modulated carrier (output) signal in response to the phase modulation signal from the PLL 702. In turn, the phase modulated carrier signal from the VCO 704 is coupled back to the PLL 702 and is used to regulate the phase modulation signal generated thereby. In this way, a feedback control relationship is established and the PLL 702 and the VCO 704 cooperatively define a phase modulator.

It is important to note that the VCO 704 provides the phase modulated carrier signal as a differential or "floating" output signal by way of respective nodes 706 and 708. In one implementation, the VCO 704 is configured such that node 706 is always of positive electrical polarity relative to node 708. Other implementations employing other polarity configurations of nodes 706 and 708 can also be used. In any case, the phase modulated carrier signal provided by the VCO 704 can be coupled to (or accessed) in an inverted or non-inverted manner.

The system 700 includes a crossover switch (switch) 710. The switch 710 is configured to selectively couple the phase modulated carrier signal as provided at nodes 706 and 708 to a pair of switch 710 output nodes 712 and 714, respectively, in accordance with the instantaneous state of a zero crossing signal (ZCS). In one implementation, the zero crossing signal is a single-bit digital signal. In one illustrative and non-limiting implementation, the switch 710 is configured to operate according to TABLE 1 below:

TABLE 1

| ZCS | Node 706 Coupling | Node 708 Coupling | Output State |
|---|---|---|---|
| 0 | Node 712 | Node 714 | Non-Inverted |
| 1 | Node 714 | Node 712 | Inverted |

Thus, in accordance with TABLE 1 above, the switch 710 couples (i.e., connects) node 706 directly to node 712, and couples node 708 directly to node 714, in response to a "0" (i.e., non-inverted) state of the zero crossing signal. Conversely, the switch 710 couples node 706 directly to node 714, and couples node 708 directly to node 712, in response to a "1" (i.e., inverted) state of the zero crossing signal. Other implementations of the crossover switch 710 can also be used. In any case, the switch 710 is configured to selectively invert the phase modulated carrier signal presented at output nodes 712 and 714 under the control of the zero crossing signal.

The system 700 also includes an amplitude modulator 716. The amplitude modulator 716 is configured to receive a baseband amplitude signal A(t) and provide (i.e., output) a corresponding amplitude modulation signal. The system 700 further includes a mixer 718. The mixer 718 is configured to receive the selectively inverted phase modulated carrier signal at nodes 712 and 714 and the amplitude modulation signal from the amplitude modulator 716 and provide (i.e., output) a polar modulated carrier signal. The polar modulated carrier signal corresponds to a predetermined digital symbol constellation (e.g., four symbols, eight symbols, sixteen symbols, etc.).

The system 700 is illustrative of a polar modulation system (or circuitry) in accordance with the present teachings. In this system, the phase input to the phase modulator 402 is continuous, without any abrupt changes. As a result, overall signal distortion is reduced and data throughput is increased under system 700 relative to that of known polar modulation techniques (e.g., system 200).

Illustrative Apparatus

Figure 8:
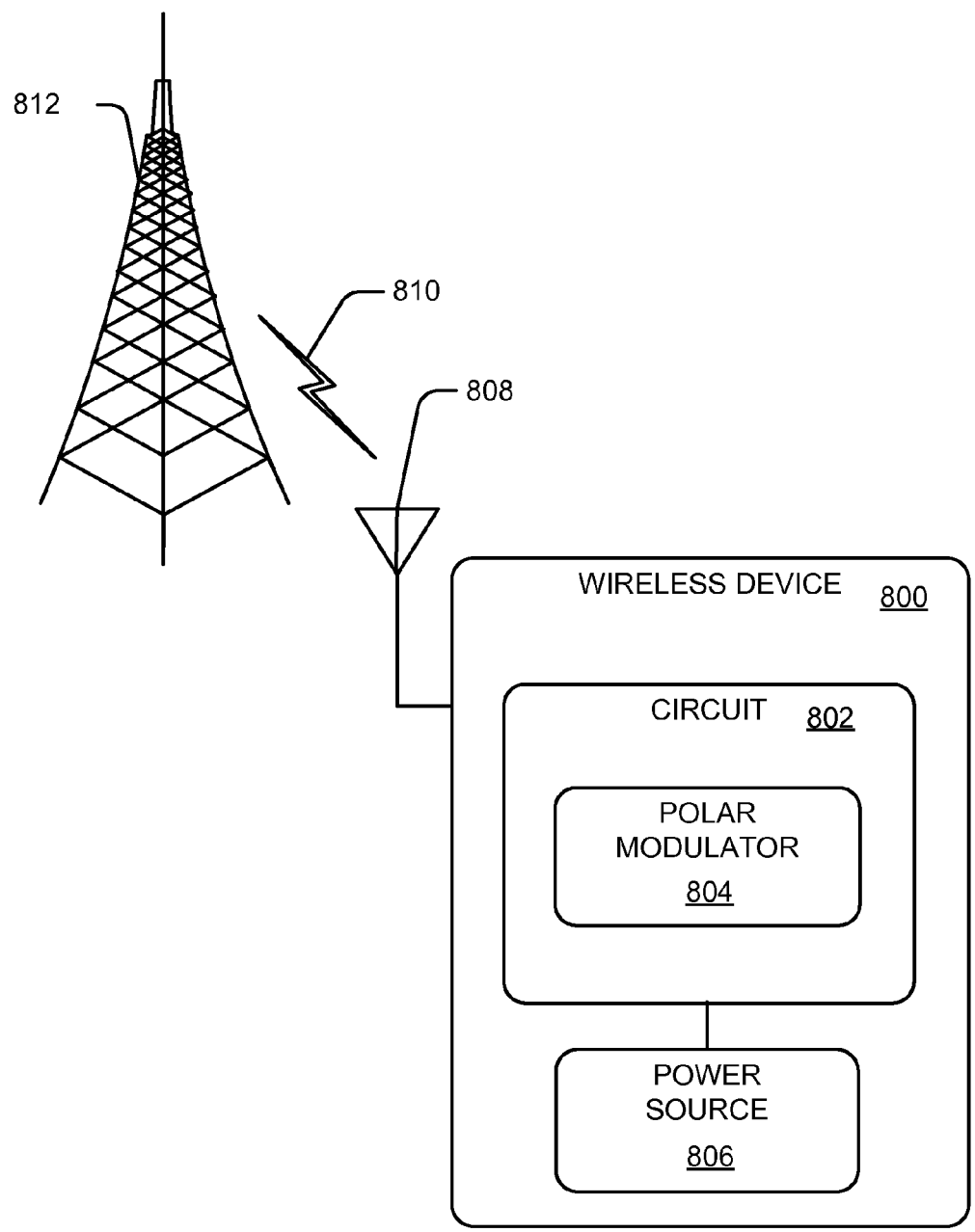
FIG. 8 is a block diagram depicting an apparatus in accordance with the present teachings.

FIG. 8 is a block diagrammatic view depicting a wireless device (i.e., apparatus) 800 including aspects of the present teachings. For purposes of non-limiting example, the wireless device 800 is presumed to include various resources that are not specifically depicted in the interest of clarity. The wireless device 800 is further presumed to be configured to perform in one or more wireless operating modes (e.g., cellular communications, global positioning system (GPS), UMTS and LTE receptions, etc.).

The wireless device 800 includes a circuit 802. The circuit 802 includes, among other possible features, a polar modulator 804. The polar modulator 804 is configured to perform in accordance with the present teachings. Thus, the polar modulator 804 can be implemented by way of the polar modulation system 400 or the polar modulation system 700. Other implementations in accordance with the present teachings can also be used. In any case, the polar modulator 804 provides a polar modulated radio frequency (RF) carrier signal configured to convey digital information in accordance with a predetermined digital symbol constellation.

The wireless device 800 further includes a source of electrical energy or "power source" 806. In one or more implementations, the power source 806 is defined by one or more batteries. In other implementations, the power source 806 may be defined by an inductively coupled power supply that is energized by an electromagnetic illumination field provided by some entity external to the wireless device 800. Other types of power source 806 may also be used. In any case, the power source 806 is coupled so as to provide electrical energy to the circuit 802. In this way, the wireless device 800 is presumed to be operable in a portable manner.

The wireless device 800 further includes an antenna 808. The wireless device 800 is presumed to operate by way of wireless signals 810, including the polar modulated carrier signal discussed immediately above, between the antenna 808 and a wireless network 812. A single cellular tower 812 is depicted in the interest of simplicity. However, it is to be understood that other resources (not shown) of a corresponding wireless network are also present and operative as needed so as to enable the wireless device 800 to perform its various functions (cellular communications, Internet access, etc.). The wireless device 800 is a general and non-limiting example of countless devices and systems that may be configured and operating in accordance with the means and techniques of the present teachings.

Conclusion

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. A circuit, comprising:
    a phase shifter configured to selectively shift a phase of a baseband phase signal in accordance with a zero crossing signal to output a selectively phase-shifted signal;
    a phase modulator configured to provide a phase modulated carrier signal in accordance with the selectively phase-shifted signal; and
    an inverter configured to selectively invert the phase modulated carrier signal in accordance with the zero crossing signal.

2. The circuit according to claim 1, wherein a phase of the selectively phase-shifted signal is continuous when the circuit detects zero crossing or near zero crossing in a constellation diagram.

3. The circuit according to claim 1, wherein the zero crossing signal corresponds to a zero crossing event within a predetermined polar modulation scheme.

4. The circuit according to claim 1, wherein the baseband phase signal corresponds to a digital information stream.

5. The circuit according to claim 1 further comprising:
    an amplitude modulator configured to provide an amplitude modulated signal in accordance with a baseband amplitude signal; and
    a mixer configured to modulate an amplitude characteristic of the selectively inverted phase modulated signal in accordance with the amplitude modulated signal so as to derive a polar modulated carrier signal.

6. The circuit according to claim 5, wherein the baseband amplitude signal corresponds to a digital information stream.

7. The circuit according to claims 1, wherein the phase shifter is configured to selectively shift the phase of the baseband phase signal one hundred eight degrees in accordance with the zero crossing signal to output the selectively phase-shifted signal.

8. A modulation circuit, comprising:
    a phase shifter configured to selectively shift a phase of a baseband phase signal in accordance with a zero crossing signal to output a selectively phase-shifted signal;
    a phase-lock loop configured to provide a phase modulation signal in accordance with the selectively phase-shifted signal;
    a variable controlled oscillator configured to provide a differential phase modulated signal in accordance with the phase modulation signal, the differential phase modulated signal provided by way of a first node and a second node; and
    a switch configured to selectively route the differential phase modulated signal from the first node and the second node to a third node and a fourth node in accordance with the zero crossing signal.

9. The modulation circuit according to claim 8, wherein the switch is further defined by a crossover switch configured to:
    couple the first node to the third node and couple the second node to the fourth node in response to a first state of the zero crossing input signal; and
    couple the first node to the fourth node and couple the second node to the third node in response to a second state of the zero crossing input signal.

10. The modulation circuit according to claim 9, further comprising:
    an amplitude modulator configured to provide an amplitude modulation signal in accordance with an amplitude input signal; and a mixer coupled to the third node and the fourth node, the mixer configured to mix the differential phase modulated signal and the amplitude modulation signal so as to derive a polar modulated carrier signal.

11. The modulation circuit according to claim 10, wherein:
the baseband phase signal and the amplitude input signal respectively correspond to a digital baseband signal; and
the zero crossing signal corresponds to a zero crossing event within a predetermined polar modulation scheme.

12. The modulation circuit according to claim 8, wherein the modulation circuit is configured to operate in accordance with a digital symbol constellation of at least four symbols.

13. The modulation circuit according to claim 8, wherein a phase of the selectively phase-shifted signal is continuous when the circuit detects zero crossing or near zero crossing in a constellation diagram.

14. The modulation circuit according to claim 8, wherein the modulation circuit is at least partially defined by an integrated circuit.

15. The modulation circuit according to claim 8, wherein the phase shifter is configured to selectively shift the phase of the baseband phase signal one hundred and eight degrees in accordance with the zero crossing signal to output the selectively phase-shifted signal.

16. A method, comprising:
selectively shifting a phase of a baseband phase signal in accordance with a zero crossing signal to output a selectively phase-shifted signal;
deriving a phase modulated radio frequency carrier signal from the selectively phase-shifted signal; and
selectively inverting the phase modulated radio frequency carrier signal in accordance with the zero crossing signal.

17. The method according to claim 16, wherein:
the phase modulated radio frequency carrier signal is further defined by a differential phase modulated radio frequency carrier signal provided at a first electrical node and a second electrical node;
the selectively inverting the phase modulated radio frequency carrier signal includes selectively coupling the first electrical node to either a third electrical node or a fourth electrical node according to the zero crossing signal;
and the selectively inverting the phase modulated radio frequency carrier signal also includes selectively coupling the second electrical node to either the fourth electrical node or the third electrical node according to the zero crossing signal.

18. The method according to claim 16, further comprising:
deriving an amplitude modulated signal from an amplitude input signal; and
mixing the selectively inverted phase modulation signal and the amplitude modulated signal so as to derive a polar modulated radio frequency carrier signal.

19. The method according to claim 16, wherein selectively shifting the phase of the baseband phase signal selectively shifts the phase of the baseband phase signal one hundred eighty degrees in accordance with the zero crossing signal to output the selectively phase-shifted signal.

20. An apparatus, comprising:
a source of electrical energy; and
an electronic circuit coupled to the source of electrical energy, the electronic circuit configured to:
selectively shift a phase of a baseband phase signal in accordance with a zero crossing signal to output a selectively phase-shifted signal;
derive a phase modulated carrier signal from the selectively phase-shifted signal;
selectively invert the phase modulated signal in accordance with the zero crossing signal;
derive an amplitude modulated signal from a baseband amplitude signal; and
mix the selectively inverted phase modulated carrier signal with the amplitude modulated signal so as to derive a polar modulated carrier signal.

21. The apparatus according to claim 20, wherein the apparatus is configured to perform one or more wireless functions using the polar modulated carrier signal.

22. The apparatus according to claim 20, wherein the baseband phase-shifted signal and the baseband amplitude signal respectively correspond to a digital information stream.

23. The apparatus according to claim 20, wherein the zero crossing signal corresponds to zero crossing event within a predetermined polar modulation scheme, the polar modulation scheme defined by a constellation of at least four digital symbols.

24. The apparatus according to claim 20, wherein the selectively shifting of the phase of the baseband phase signal shifts the phase one hundred eighty degrees in accordance with the zero crossing signal to output the selectively phase-shifted signal.

* * * * *